US009008751B2

(12) United States Patent
Guttman et al.

(10) Patent No.: US 9,008,751 B2
(45) Date of Patent: *Apr. 14, 2015

(54) REAL TIME, INTERACTIVE VOLUMETRIC MAGNETIC RESONANCE IMAGING

(75) Inventors: Michael Guttman, Derwood, MD (US); Elliot R. McVeigh, Phoenix, AR (US)

(73) Assignee: The United States of America, as represented by the Secretary, Department of Health & Human Services, Washington, DC (US)

(*) Notice: Subject to any disclaimer, the term of this patent is extended or adjusted under 35 U.S.C. 154(b) by 0 days.

This patent is subject to a terminal disclaimer.

(21) Appl. No.: 13/305,496

(22) Filed: Nov. 28, 2011

(65) Prior Publication Data

US 2012/0253169 A1    Oct. 4, 2012

Related U.S. Application Data

(63) Continuation of application No. 10/076,882, filed on Feb. 14, 2002, now Pat. No. 8,068,893.

(60) Provisional application No. 60/269,363, filed on Feb. 16, 2001.

(51) Int. Cl.
G06T 15/08 (2011.01)
G01R 33/56 (2006.01)
G01R 33/563 (2006.01)

(52) U.S. Cl.
CPC ............ *G06T 15/08* (2013.01); *G01R 33/5608* (2013.01); *G01R 33/56308* (2013.01)

(58) Field of Classification Search
USPC ........... 600/410, 411; 382/128; 345/419, 619, 345/629, 475; 324/307, 309
See application file for complete search history.

(56) References Cited

U.S. PATENT DOCUMENTS

| 4,796,635 | A | 1/1989 | Dumoulin |
|---|---|---|---|
| 5,329,925 | A | 7/1994 | NessAiver |
| 5,782,762 | A | 7/1998 | Vining |
| 6,129,670 | A | 10/2000 | Burdette et al. |
| 6,160,398 | A | 12/2000 | Walsh |
| 6,166,544 | A | 12/2000 | Debbins et al. |
| 6,185,445 | B1 | 2/2001 | Knuttel |
| 6,275,721 | B1 | 8/2001 | Darrow et al. |
| 6,280,387 | B1 | 8/2001 | Deforge et al. |
| 6,317,619 | B1 | 11/2001 | Boernert et al. |
| 6,417,861 | B1 | 7/2002 | Deering et al. |

OTHER PUBLICATIONS

Haishi, T. et al., Development of a Real-Time 3D NMR Imaging System, 7th Annual Meeting of the International Society for Magnetic Resonance in Medicine (May 1999).

(Continued)

*Primary Examiner* — Parikha Mehta
(74) *Attorney, Agent, or Firm* — Locke Lord LLP; Jeffrey D. Hsi; Gabriel J. McCool

(57) ABSTRACT

A method of producing volume renderings from magnetic resonance image data in real time with user interactivity. The method comprises collecting raw magnetic resonance image (MRI) data representative of shapes within an image volume; transferring the raw MRI data to a computer; and continuously producing volume renderings from the raw MRI data in real time with respect to the act of collecting raw MRI data representative of shapes within the image volume.

16 Claims, 2 Drawing Sheets

(56) References Cited

OTHER PUBLICATIONS

Pfister, H., Architectures for Real-Time Volume Rendering, *Future Generation Computer Systems*, vol. 15, pp. 1-9, (1999).

Diallo, B. et al., Voxeline: A Software Program for 3D Real-Time Visualizations of Biomedical Images, *Computerized Medical Imaging and Graphics*, vol. 22, pp. 275-289 (1998).

Marovic, B. et al. Visualization of 3D Fields and Medical Data and Using VRML, *Future Generation Computer Systems*, vol. 14, pp. 33-49, (1998).

Choi, J. et al. Efficient Volumetric Ray Casting for Isosurface Rendering, *Computers & Graphics*, vol. 24, pp. 661-670 (2000).

REAL TIME, INTERACTIVE VOLUMETRIC MAGNETIC RESONANCE IMAGING

The present application is a continuation of U.S. application Ser. No. 10/076,882, filed Feb. 14, 2002, which claims priority of U.S. provisional application No. 60/269,363 filed Feb. 16, 2001, both of which applications are incorporated herein by reference.

TECHNICAL FIELD

The present invention relates to magnetic resonance imaging (MRI), and more particularly, to volume-rendered magnetic resonance imaging that is real time with respect to the time that raw MRI data is collected.

BACKGROUND

It is a common procedure for a caregiver to make an image of a patient's body while either planning or performing a surgical procedure. One type of image that is particularly useful is a volume rendering produced from magnetic resonance image (MRI) data, which enables a caregiver to achieve a greater understanding of anatomical shapes and motion. Examples of procedures for using an MRI include angiography for identifying vascular disease, or locating abnormal tissue for possible surgical resection.

A problem with current methods of generating volume renderings from MRI data, however, is that generation of the renderings is slow. In some methods, the MRI scanner generates data for a series of parallel two-dimensional image slices and downloads them to a computer. The computer stores this data and then creates a volume rendering from the two-dimensional slices. One of the problems with this technique is that the volume is rendered off line and thus there is a substantial latency between the time the data is gathered and the time the volume is rendered.

This latency is acceptable for some diagnostic procedures such as an examination to locate and identify abnormal tissue such as cancerous tumors. However, this latency can cause problems in other procedures such as surgical procedures or interventions. An example of such a problem is misregistration between the image and the patient's actual anatomy. Misregistration can occur because of a variety of events such as surgical manipulation or movement of the patient's muscles through normal contraction and relaxation.

One technique to reduce the latency of the volume renderings is to speed up the rendering process itself. This improves user interactivity, such as rotating or translating. It is often referred to as "real-time volume rendering," but neglects the fact that the image data itself is not real-time, and could have been acquired well before the rendering takes place. Hence, it is not real-time with respect to when the MRI data was acquired.

In other techniques, real-time magnetic resonance (MR) imaging has been achieved, but only when displaying two-dimensional images. These two-dimensional techniques often employ a thin slice to visualize structures in fine detail. However, when manipulating an interventional device, such as a catheter, the tip of the device will frequently move out of the imaging plane as it travels through a patient's body. At this point, the device tip is no longer visible. One way to work around this problem is to continually adjust the position of the imaging plane to include the catheter tip. The caregiver can manually make this adjustment on the computer while viewing the image, but has to continuously and manually adjust the image plane, which is inconvenient and increases the risk of error.

Another way to work around the problem of the catheter tip leaving the image plane is to use a technique called active tip tracking, where a device determines the coordinates of the catheter tip and automatically adjusts the scan plane. However, active tip tracking requires a more complicated catheter design and additional computer hardware or software resources. Not only does this technique increase the complexity and cost of the equipment required for both the catheterization procedure and the MRI system, it can result in a degradation of the image quality if not designed properly.

SUMMARY

The present invention is directed to a method of rendering volumes from magnetic resonance image data in real time. The method comprises: collecting magnetic resonance image (MRI) data representative of shapes within an image volume; transferring the MRI data to a computer; and rendering a volume from the MRI data in real time with respect to the act of collecting MRI data representative of shapes within the image volume.

The present invention is also directed to an apparatus for producing volume renderings from magnetic resonance image data in real time. The apparatus comprises a magnetic resonance image (MRI) scanner configured to generate MRI data representative of shapes within an image volume. A computer is in data communication with the MRI scanner and is configured to receive the MRI data from the MRI scanner and to produce a volume rendering from the MRI data in real time with respect to the act of collecting the MRI data.

DETAILED DESCRIPTION

Figure 1:
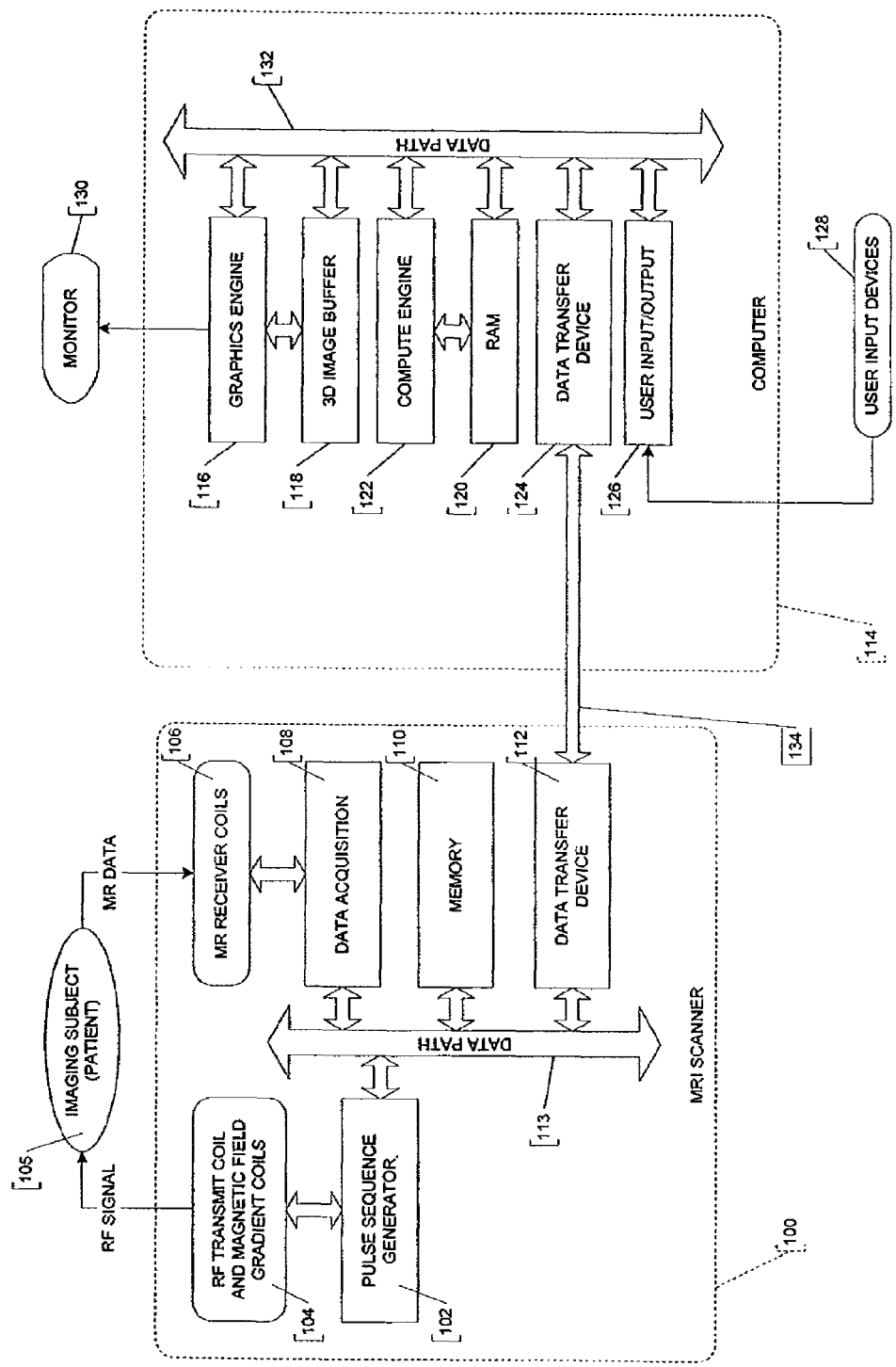
FIG. 1 is a functional block diagram of an MRI scanner and a computer embodying the present invention.

Various embodiments of the present invention, including a preferred embodiment, will be described in detail with reference to the drawings wherein like reference numerals represent like parts and assemblies throughout the several views. Reference to the described embodiments does not limit the scope of the invention, which is limited only by the scope of the appended claims.

Additionally, the logical operations of the various embodiments of the invention described herein are implemented as: (1) a sequence of computer implemented steps running on a computing system of a work station or an MRI scanner; and/or (2) interconnected machine modules or programmed engines within the computing system. The implementation used is a matter of choice, and the logical operations making up the embodiments of the invention described herein may be referred to as operations, steps, or modules.

In general terms, the present invention relates to processing MRI data to create a stream of volume renderings in real time with respect to the time that a scanner collects the MRI data from an imaging sample, such as a patient's body. The MRI scanner collects data from the patient and downloads the data to a computer system that continuously processes the data and produces volume renderings depicting internal structures.

The volume is rendered concurrently with MRI data acquisition and download, which provides a low latency between the time the data is collected from the patient and the time the volume is rendered. It may also provide the generation of many renderings per second. The rendering is continuously refreshed with new MRI image data, and a caregiver can view changes in shapes as they occur within a patient's body. It also allows a caregiver to obtain real-time three-dimensional feedback while manipulating objects within a patient's body.

Figure 2:
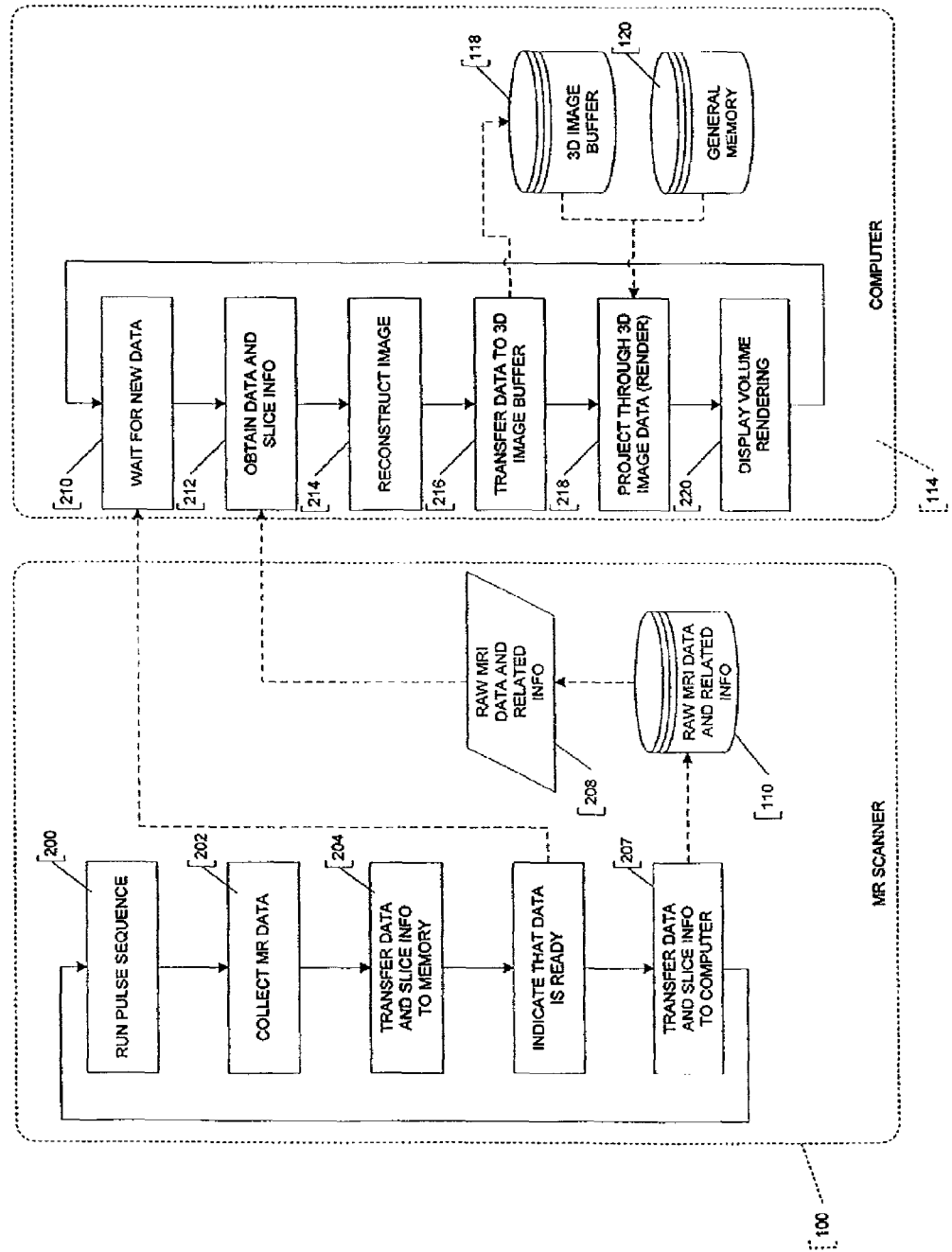
FIG. 2 is a flow chart illustrating operation of the MRI scanner and computer illustrated in FIG. 1.

FIGS. 1 and 2 illustrate the hardware and operation, respectively, of one possible embodiment of a system that embodies the invention. An MRI scanner is generally shown as 100, and can be any type of scanner that is useful for performing magnetic resonance imaging. An example of such a scanner is Signa 1.5 Tesla Echospeed MR Scanner using a 4-element cardiac phased-array coil, which is commercially available from General Electric Medical Systems of Milwaukee, Wis. However, the claimed invention can be embodied using a variety of other MRI scanners and other coil arrangements.

The MRI scanner 100 includes a data path 113 that provides data communication between a pulse sequence generator 102, data acquisition subsystem 108, random access memory (RAM) 110, and a data transfer device 112 such as a model 618-9U bus adaptor, which is commercially available from the Bus Adaptor Group of SBS Technologies, Inc. in St. Paul, Minn. The data transfer device is connected to a data acquisition rack (not shown) of the MRI scanner 100 and provides bi-directional data communication between the MRI scanner 100 and a computer 114.

The pulse sequence generator 102 is in communication with magnetic field gradient coils 103 and radio frequency (RF) transmit coils 104. The data acquisition subsystem 108 is in communication with and receives information from magnetic resonance (MR) receiver coils 106. In one possible embodiment, the pulse sequence generator 102 generates a two-dimensional gradient-recalled echo-train pulse sequence using view sharing between even and odd echoes, which doubles the rate at which frames of the image can be rendered by the computer 114. Other possible embodiments use other types of two-dimensional pulse sequences or even three-dimensional pulse sequences.

In operation, referring to FIGS. 1 and 2, a patient 105 is placed in a static magnetic field that is generated by the MRI scanner 100. The static magnetic field aligns protons within tissues of the patient's body. During operation 200 of the MRI scanner 100, the pulse sequence generator 102 generates waveforms that are sent to the RF and magnetic field gradient coils 104. These waveforms cause perturbations in the proton alignments in order to produce "echo" signals, which are picked up by the MR receiver coils 106. There is one MR receiver coil for each channel of the MRI scanner 100. In one possible embodiment, the MRI scanner 100 has four channels and hence four MR receiver coils 106, which provide greater signal-to-noise ratio than if fewer channels, are used.

When a two-dimensional pulse sequence is used, the raw MRI data collected corresponds to imaging planes called slices. Each image slice is given a slice number identifying its location relative to other image slices generated by the MRI scanner 100. This slice number is stored in memory 110 together with the raw MRI data that corresponds to the slice. In one possible embodiment, the image slices are parallel to one another and are equally spaced. The image slices can be generated in any order, although one possible embodiment generates them sequentially.

During operation 202, the data acquisition subsystem 108 samples the electrical signal induced in the MR receiver coils 106, converting the sampled electrical signals from analog to digital and then storing them in the memory 110 at operation 204. Information related to the raw MRI data is also stored in the memory 110. Examples of this related information include the image slice number, resolution, field-of-view, orientation of the slice, and time and data stamps. During operation 202, the data acquisition subsystem 108 also may perform other signal processing steps to the sampled electrical signals including amplification and filtering.

After the raw MRI data is collected for a slice, operation 206 generates a data ready signal that is communicated to the computer 114 and then at operation 207 immediately begins to transfer the raw MRI data and related information 208 to the computer 114. The raw MRI data and related information is transferred from the memory 110, through the data transfer device 112, and across the data bus 134 to the computer 114 for processing to produce the volume rendering. In one possible embodiment, two-dimensional MRI data are transferred at a rate of 15 images per second or higher.

The operations 200, 202, 204, and 206 are repeated, until the loop is interrupted by user intervention or otherwise. Repeating the MRI scans indefinitely provides a continuous stream of raw MRI data that is generated, stored in memory 108, and transferred to the computer 114.

In one possible embodiment, operation 204, which transfers the raw MRI data to the computer 114, is performed after the data acquisition for each image slice is completed. However, the raw MRI data and related information can be downloaded to the computer 114 more or less frequently. For example, the raw MRI data and related information can be downloaded to the computer 114 several times during the generation of a single image slice or only after the generation of a plurality of image slices is complete.

Referring back to FIG. 1, the computer 144 processes the raw MRI data to reconstruct images and produce volume renderings. The computer 114 can be any type of computer that is capable of processing data and rendering a graphical display. In one possible embodiment, the computer 114 is a multiprocessor computer that is capable of parallel processing using multi-threading programming techniques. An example of such a computer is an Onyx2 Reality™ visualization system, which utilizes four microprocessors and is commercially available form Silicon Graphics, Inc. of Mountain View, Calif. Other embodiments use other types of computing systems and may not utilize parallel processing.

The computer 114 includes a data bus 132; a monitor 130; random access memory (RAM) 120, which provides general memory; high-speed graphics memory, in which is located a 3D image buffer 118 for temporarily storing reconstructed image data; a data transfer device 124; and an input/output subsystem 126 that provides an interface for various peripherals such as user input devices 128. The data bus 132 provides data communication between the various hardware components of the computer 114. The data transfer device 124 provides data communication with the data bus 134 and hence the MRI scanner 100. An example of one possible data transfer device 124 is the model 618-9U bus adaptor. The computer also includes storage devices such as a hard disk drive or other drive for storing data on a removable media such as a floppy disk, a compact disk (CD), a digital video disk (DVD), or any other recordable media.

Additionally, the RAM 120 shares a data bus with the compute engine 122, and the 3D image buffer 188 shares a data bus with the graphics engine 116. In another embodiment, the general memory and the 3D image buffer are partitioned within the same RAM 120.

The monitor 130 can be any type of monitor suitable for displaying a graphical image. In one possible embodiment, the monitor 130 is an MRI compatible LCD display such as models MRI18H or MRI18L, which are commercially available from Aydin Displays, Inc. of Horsham, Pa. The monitor 130 and the user input devices 128 then can be placed in a gantry room close to the MRI scanner 100. This position enables a caregiver to view and manipulate the volume rendering while performing procedures on a patient. Another possible embodiment utilizes a stereoscopic display, which provides a full three-dimensional effect when using a stereographic viewing device such as Crystal Eyes™ goggles, commercially available from Stereographics Corp. of San Rafael, Calif.

In one embodiment, the computer contains two main processing modules, the compute engine 122, and the graphics engine 116. The compute engine 122 is used for managing the flow of MR image data, performing reconstruction of images, responding to user input, and control of the graphics engine 116, including the submission of new image data to the 3D image buffer 118. The graphics engine 116 is used for creating the volume rendering from the images stored in the 3D image buffer 118. Below, we discuss multi-threading for execution of compute engine 122 tasks in parallel, though other embodiments may use different thread configurations or may not use multi-threading at all.

The compute engine 122 utilizes threads to parallelize data transfer, image reconstruction, and control of the graphics engine 116. The data transfer thread includes code for communicating with the MRI scanner 100 to coordinate the downloading of raw MRI data and related information 208 from the MRI scanner 100 and the transmission of commands from the computer 114 to the MRI scanner 100. The data transfer thread also stores the raw MRI data and related information 208 into the RAM 120 when it is downloaded from the MRI scanner 100.

Additionally, there is one image reconstruction thread for each MR receive coil 106 of the MRI scanner. In one embodiment, the compute engine 122 utilizes four image reconstruction threads. The image reconstruction threads process the raw MRI data to generate reconstructed image data and storing that reconstructed image data into RAM 120. Another thread prepares the graphics engine 116 to receive the newly reconstructed image data, and replaces only that portion of image data in the 3D image buffer 118 corresponding to the slice number that has been newly reconstructed. This selective replacement reduces the data transfer overhead and increases system throughput. The graphics engine 116, upon instruction from the compute engine 122, retrieves the reconstructed image data from the 3D image buffer 118 and generates the volume rendering on the monitor 130.

In one possible embodiment, the image reconstruction is performed with known Fourier transform reconstruction techniques using the FFTW library, which was developed at the Massachusetts Institute of Technology. Raw data is zero padded up to 192 points in the x axis (frequency encoding) and 192 times the fractional phase field-of-view in the y axis (phase encoding). The phase field-of-view can be set to some fraction less than 1 to increase the frame rate by reducing the number of phase encodings or echoes required, at the cost of reducing the field-of-view in the phase encoding direction. For example, the phase field-of-view can be set to values of 0.5 or 0.75. Other reconstruction techniques can be used such as wavelets and projection reconstruction. Additionally, the compute engine 122 can use time domain filtering or other appropriate techniques and processes to reduce noise and artifacts in the image.

Referring back to FIG. 2, during operation, the computer 114 initially waits at operation 210 until it receives an interrupt from the data transfer device 124. The data ready signal from the data transfer device 112 on the MRI scanner 100 causes the device in the computer 124 to generate an interrupt that is handled by the data transfer thread on the computer 114. This signal indicates that new raw MRI data and related information 208 is ready to be transferred to the computer 114. This interrupt provides synchronization between the MRI scanner and the computer 114. At operation 212, the computer 114 receives the raw MRI data and related information 208 from the computer 114, and the data transfer thread of the compute engine 122 transfers the raw MRI data to the memory 120. During operation 214, the reconstruction threads retrieve the raw MRI data from the RAM 120, processes the raw MRI data, and generate the reconstructed image data.

The compute engine 122 also stores the reconstructed image data in the 3D image buffer 118 at operation 218. If the reconstructed image is based on a scan using a two-dimensional pulse sequence, each slice is stored in a block of memory that corresponds to its slice number. Thus, the first slice of reconstructed image data is assigned to a first memory block. The second slice of reconstructed image data is then assigned to the next consecutive or second memory block.

In one possible embodiment, this sequential storage of slices occurs even if the slices are not scanned sequentially. For example, if the second slice or reconstructed image data is actually scanned after the third slice, it is still stored in the second block of memory between the first and third slices. Other possible embodiments do not sequentially store image slices so that each consecutive slice is stored in a consecutive block of memory. If a three-dimension pulse sequence is used, MRI data corresponding to the 3D rectilinear slab is produced, reconstructed, and only one memory location is needed in the 3D image buffer.

The computer 114 stores the raw MRI data and reconstructed image data on a more permanent memory such as a hard drive in addition to storing the data in the memory 120 and the 3D image buffer 118, respectively. The raw MRI data and related information is continuously stored on the hard drive in a binary file. This data can then be used to reconstruct the volume renderings at a latter date. The hard drive also includes a circular buffer file that stores the most recent 128 sets or slices of raw MRI data and related information. Additionally, each image slice or rectilinear slab is stored in a separate file so that the images can be easily viewed, printed, or downloaded.

At operation 220, the graphics engine 116 retrieves the reconstructed image data from the 3D image buffer 118 and renders a volume on the monitor 130. If the image is formed from a series of two-dimensional image slices, the slices are continuously inserted into the 3D image buffer 118, and the volume rendering is continuously refreshed on the monitor 130 by the graphics engine 116. This continuous display of volume renderings provides three-dimensional feedback that is in real time relative to the time that the raw MRI data is collected.

In one possible embodiment, the volume rendering is updated on the monitor 130 by the graphics engine 116 after reconstruction of the entire set of raw MRI data corresponding to each slice is completed and stored in the 3D image buffer 118. In another possible embodiment, the volume rendering is displayed by the graphics engine 116 as it is processed and stored in the 3D image buffer 118 regardless of whether processing for the entire set of raw MRI data corresponding to the image slice is completed by the compute engine 122. The latter embodiment uses what is referred to as 'partial updates' to speed the apparent frame rate of the rendering.

If the reconstructed image data is in the form of a three-dimensional rectilinear slab, as obtained from a three-dimensional pulse sequence, the graphics engine 116 will continuously update the volume rendering displayed on the monitor 130 after each set of the reconstructed image data is completed and loaded into the 3D image buffer 118. In an alternative embodiment, the graphics engine 116 continuously updates the volume rendering displayed on the monitor 130 as each reconstructed image is generated and loaded into the 3D image buffer 118. This continuous update of the volume rendering occurs regardless of whether the MRI scanner 100 has completed the scan or the compute engine 122 has completed processing the set of raw image data from a scan based on three-dimensional pulse sequence.

The graphics engine 116 can render the image for display on the monitor 130 using any appropriate graphics software. In one possible embodiment, the compute engine 122 makes calls to the OpenGL Volurnizer™ graphics library and the OpenGL® application program interface (API), both of which are commercially available from Silicon Graphics, Inc. The Open GL Volumizer™ graphics library can utilize three-dimensional texturing with trilinear interpolation mapping when polygonizing the data and rendering the volume on the monitor 130 using predefined blend functions. The OpenGL® API enables selective replacement of three-dimensional texture sub-regions corresponding to newly processed reconstructed image data corresponding to a slice or a rectilinear slab. This selective replacement reduces data transfer overhead and when repeated continuously, providing real-time updates of the volume rendering on the monitor 130.

The operations 210, 212, 214, 216, 218, and 220 are repeated until the loop is interrupted by user intervention or otherwise. Repeating these operations indefinitely while receiving a continuous stream of raw MRI data 208 from the MRI scanner 100 provides continuous and real-time updates to the volume rendering that is displayed on the monitor 130.

These updates are in real-time with respect to the time that the raw MRI data is collected from an imaging sample such as section of a patient's body. It is to be understood that with real time processing, there is some measure of delay between the time the raw MRI data is collected and the three-dimensional image is rendered due to processing times, data transmission rates, and other system overheads. This delay time is referred to as the latency.

Accordingly, the real-time processing described herein provides a relatively low latency between the time the raw MRI data is collected and the time that the volume is rendered and provides a relatively high frame rate. In one possible embodiment, for example, the latency is below about one third of a second and the frame rate is above about 10 frames per second. In other embodiments, the latency is greater than one third of a second and the frame rate is lower than about 10 frames per second. In yet other possible embodiment, the latency is lower, and might be between about one quarter of a second and about one third of a second, and still other embodiments might have a latency that is as at about one quarter of a second or less. Similarly, there are embodiments that have higher frame rates. For example, one embodiment has a frame rate of about 20 frames or more per second.

One skilled in the art will recognize that achieving a certain image quality together with a low latency and a high frame rate is accomplished by balancing a variety of factors in the MRI scanning process. Examples of these factors include the scan rate, the points sampled per echo, the number of echoes per excitation, the length of the excitations, the flip angle, the slice thickness, and the size of the pixels as determined by the field-of-view.

In addition to transferring raw MRI data from the MRI scanner 100 to the computer 114, the computer 114 can transmit commands to the MRI scanner 100 via the data bus 134. An example of such a command is to specify a new orientation on which to acquire MR image slices. In one embodiment, this specification may be accomplished efficaciously by having the user specify the position of a cut plane through the volume rendering, which causes the volume not to be rendered on one side of the cut plane. The MRI scanner 100 may then be instructed to acquire one of a plurality of slices at the position and orientation of the cut plane. Other commands changing the position and orientation of the scan relative to the patient's body also can be transmitted from the computer 114 to the MRI scanner 100. Automated scan plane orientation can be used to continually optimize the quality of the volume rendering. Resolution in the image plane is generally better than that through the image plane for MR images. As a result, the resolution of the volume rendering is better when the projection (viewing) direction is normal to the imaging planes. While the user rotates the rendering on the screen, the scanner is instructed to change the imaging plane orientation such that the projection direction is normal to the imaging planes.

The user can also interact with the volume rendering by using user input devices 128. For example, the user can rotate the three-dimensional image on the monitor 130, or position cut planes. The graphics engine 116 performs this rotation in the rendering by changing the angle at which projections are made through the three-dimensional data. Additionally, the blend function in the graphics library can be toggled between alpha blending and maximum intensity projections (MIP). In other embodiments, other blend functions may be specified. Parameters that the user sets for displaying a three-dimensional image are stored in the RAM 120 and are accessed by the graphics engine 116 and the compute engine 122 as required when generating the reconstructed image data or volume rendering. Examples of such parameters include image rotation or translation, brightness/contrast adjustment, whether alpha blending or maximum intensity projection is selected, and whether a cut plane is selected and parameters related to the cut plane.

The systems and methods described herein can be used for a variety of different applications including both surgical and diagnostic procedures. One type of application includes invasive procedures in which a caregiver inserts a device within a patient's body during surgical, vascular, or other types of interventions. Examples include catheterization for performing a variety of procedures such as angioplasty, stent placement, angiography, biopsy, tumor resection, and many others.

Examples of diagnostic procedures in which the disclosed systems and methods can be used include monitoring the flow of a contrast material through vascular structures of a patient's body. Other examples include monitoring the cardiac function (movement of the heart), pulmonary function (movement of the lungs), vocal cord function, gastrointestinal function, and joint motion.

Although the description of the preferred embodiment and method have been quite specific, it is contemplated that various modifications and equivalents are within the scope of the appended claims and can be made without deviating from the spirit of the present invention. Accordingly, it is intended that The claimed invention is:

1. An apparatus for producing three-dimensional volume renderings from magnetic resonance image data in real time, the apparatus comprising:
   a magnetic resonance image (MRI) scanner having a magnetic resonance coil configured to continuously collect MRI data representative of shapes within an image volume; and
   a computer in data communication with the MRI scanner, the computer configured to continuously receive the MRI data from the MRI scanner, to reconstruct images from partial and complete MRI data, and to produce a three-dimensional rendering of a volume from a plurality of image slices from the MRI data in real time with respect to the act of collecting the MRI data from the magnetic resonance coil,
   wherein complete MRI data for a particular image slice comprises a set of all collected MRI data for the particular image slice,
   wherein partial MRI data for the particular image slice comprises a subset of the complete MRI data for the particular image slice, and
   wherein the computer is configured to update the three-dimensional rendering based on the partial MRI data for the particular image slice and prior to processing the complete MRI data for the particular image slice.

2. The apparatus of claim 1, further comprising a monitor in connection with the computer, the computer and monitor configured such that the three-dimensional rendering of the volume is displayed on the monitor and such that updates to the three-dimensional rendering are continuously displayed on the monitor.

3. The apparatus of claim 1, wherein the computer comprises a compute engine processing module configured to manage receipt of the MRI data from the MRI scanner and to reconstruct images from partial or complete data, and a graphics engine processing module configured to produce the three-dimensional rendering.

4. The apparatus of claim 3, wherein the graphics engine processing module is configured to produce the three-dimensional rendering, and to continuously update the three-dimensional rendering after partial changes to the MRI data.

5. The apparatus of claim 1, wherein the MRI scanner and the computer are configured to display the three-dimensional rendering of the volume on a monitor at a rate of about 10 or more frames per second.

6. The apparatus of claim 1, wherein the MRI scanner and the computer are configured to provide a latency between the act of collecting MRI data and the act of displaying the three-dimensional volume rendering that is equal to or less than about one third of a second.

7. The apparatus of claim 5, wherein the MRI scanner and the computer are configured with a latency between the act of collecting MRI data and the act of displaying the three-dimensional volume rendering that is equal to or less than about one third of a second.

8. The apparatus of claim 1, further comprising a pulse sequence generator in communication with the magnetic resonance coil and configured to execute two-dimensional or three-dimensional pulse sequences.

9. The apparatus of claim 1, wherein the computer is configured such that when a viewing angle and/or position of the three-dimensional volume rendering changes, the three-dimensional rendering is updated asynchronous to the collection of MRI data.

10. An apparatus for producing three-dimensional volume renderings from magnetic resonance image data in real time, the apparatus comprising:
    a magnetic resonance image (MRI) scanner having a magnetic resonance coil configured to continuously collect MRI data representative of shapes within an image volume; and
    a computer in data communication with the MRI scanner, the computer configured to continuously receive the MRI data from the MRI scanner, to reconstruct images from partial or complete data, and to produce a three-dimensional rendering of a volume from a plurality of image slices from the MRI data in real time with respect to the act of collecting the MRI data from the magnetic resonance coil,
    wherein the MRI scanner and the computer are configured to display the three-dimensional rendering of the volume on a monitor at a rate of about 10 or more frames per second with a latency between the act of collecting MRI data and the act of displaying the three-dimensional volume rendering that is equal to or less than about one third of a second.

11. The apparatus of claim 10, further comprising a monitor in connection with the computer, the computer and monitor configured such that the three-dimensional rendering of the volume is displayed on the monitor and such that the three-dimensional rendering is continuously updated and displayed on the monitor.

12. The apparatus of claim 10, wherein the computer comprises a compute engine processing module configured to manage receipt of the MRI data from the MRI scanner and reconstruct images from partial or complete data, and a graphics engine processing module configured to produce the three-dimensional rendering.

13. The apparatus of claim 10, wherein the computer is configured such that when a viewing angle and/or position of the three-dimensional volume rendering changes, the three-dimensional rendering is updated asynchronous to the collection of MRI data.

14. An apparatus for producing three-dimensional volume renderings from magnetic resonance image data in real time, the apparatus comprising:
    a magnetic resonance image (MRI) scanner having a magnetic resonance coil configured to continuously collect MRI data representative of shapes within an image volume; and
    a computer in data communication with the MRI scanner, the computer configured to continuously receive the MRI data from the MRI scanner, to reconstruct images from partial and complete data, and to produce a three-dimensional rendering of a volume from a plurality of image slices from the MRI data in real time with respect to the act of collecting the MRI data from the magnetic resonance coil,
    wherein the computer is configured to update the three-dimensional rendering after partial changes to the MRI data, and
    wherein the MRI scanner and the computer are configured to display the three-dimensional rendering of the volume on a monitor at a rate of about 10 or more frames per second.

15. An apparatus for producing three-dimensional volume renderings from magnetic resonance image data in real time, the apparatus comprising:
- a magnetic resonance image (MRI) scanner having a magnetic resonance coil configured to continuously collect MRI data representative of shapes within an image volume; and
- a computer in data communication with the MRI scanner, the computer configured to continuously receive the MRI data from the MRI scanner, to reconstruct images from partial and complete data, and to produce a three-dimensional rendering of a volume from a plurality of image slices from the MRI data in real time with respect to the act of collecting the MRI data from the magnetic resonance coil,
- wherein the computer is configured to update the three-dimensional rendering after partial changes to the MRI data, and
- wherein the MRI scanner and the computer are configured to provide a latency between the act of collecting MRI data and the act of displaying the three-dimensional volume rendering that is equal to or less than about one third of a second.

16. An apparatus for producing three-dimensional volume renderings from magnetic resonance image data in real time, the apparatus comprising:
- a magnetic resonance image (MRI) scanner having a magnetic resonance coil configured to continuously collect MRI data representative of shapes within an image volume; and
- a computer in data communication with the MRI scanner, the computer configured to continuously receive the MRI data from the MRI scanner, to reconstruct images from partial and complete data, and to produce a three-dimensional rendering of a volume from a plurality of image slices from the MRI data in real time with respect to the act of collecting the MRI data from the magnetic resonance coil,
- wherein the computer is configured to update the three-dimensional rendering after partial changes to the MRI data, and
- wherein the MRI scanner and the computer are configured to produce multiple three-dimensional renderings of a volume per second.

* * * * *